United States Patent [19]
Grothe et al.

[11] 3,931,490
[45] Jan. 6, 1976

[54] ELECTRON BEAM VAPORIZATION APPARATUS

[75] Inventors: Wolfgang Grothe, Lehningen; Klaus Brill, Korntal, both of Germany

[73] Assignee: Robert Bosch G.m.b.H., Gerlingen-Schillerhohe, Germany

[22] Filed: Aug. 28, 1974

[21] Appl. No.: 501,142

[30] Foreign Application Priority Data
Sept. 17, 1973 Germany............................ 2346799

[52] U.S. Cl............................. 219/121 EB; 118/49.1
[51] Int. Cl.²........................................ B23K 15/00
[58] Field of Search ... 219/121 EB, 121 EM; 13/31; 117/93.3; 118/49.1, 1, 7, 620; 250/432, 492; 427/35

[56] References Cited
UNITED STATES PATENTS

| | | | |
|---|---|---|---|
| 3,244,855 | 4/1966 | Cauley | 219/121 EB |
| 3,364,296 | 1/1968 | Smith, Jr. | 13/31 |
| 3,389,210 | 6/1968 | Whitson et al. | 13/31 |
| 3,394,217 | 7/1968 | Fisk | 219/121 EB |
| 3,394,678 | 7/1968 | Edwards et al. | 118/49.1 |
| 3,432,335 | 3/1969 | Schiller et al. | 219/121 EM X |
| 3,612,859 | 10/1971 | Schumacher | 117/93.3 X |
| 3,655,902 | 4/1972 | Finestone et al. | 13/31 |
| 3,714,416 | 1/1973 | Link et al. | 219/121 EB X |

*Primary Examiner*—Thomas J. Kozma
*Assistant Examiner*—G. R. Peterson
*Attorney, Agent, or Firm*—Flynn and Frishauf

[57] ABSTRACT

To permit coating of wide area work surfaces, such as wide tapes, ribbons and the like, a vaporization substance is retained in an elongated trough, transverse to the direction of movement of the ribbon. Alongside the trough, the pole shoes of magnets are placed to provide a magnetic shield transverse to the longitudinal extent of the trough, and with respect to the direction of movement of the web to be coated. An electron beam is then impinged on the surface of the vaporization substance in the trough at an angle between zero and 90°, preferably between 30° and 60° and desirably in the order of about 45° with respect to the direction of the magnetic field, so that the magnetic field and the electron beam will interact to deflect the electron beam to assume a spiral path which penetrates the surface of the vaporization substance. Preferably the characteristics of the electron beam and the magnetic field are so matched that primary electrons dispersed from the vapor, or from stray gases are captured in the magnetic field, and returned to the vaporization substance; likewise, electrons liberated at the impingement points are deflected back to the vaporization substance.

13 Claims, 5 Drawing Figures

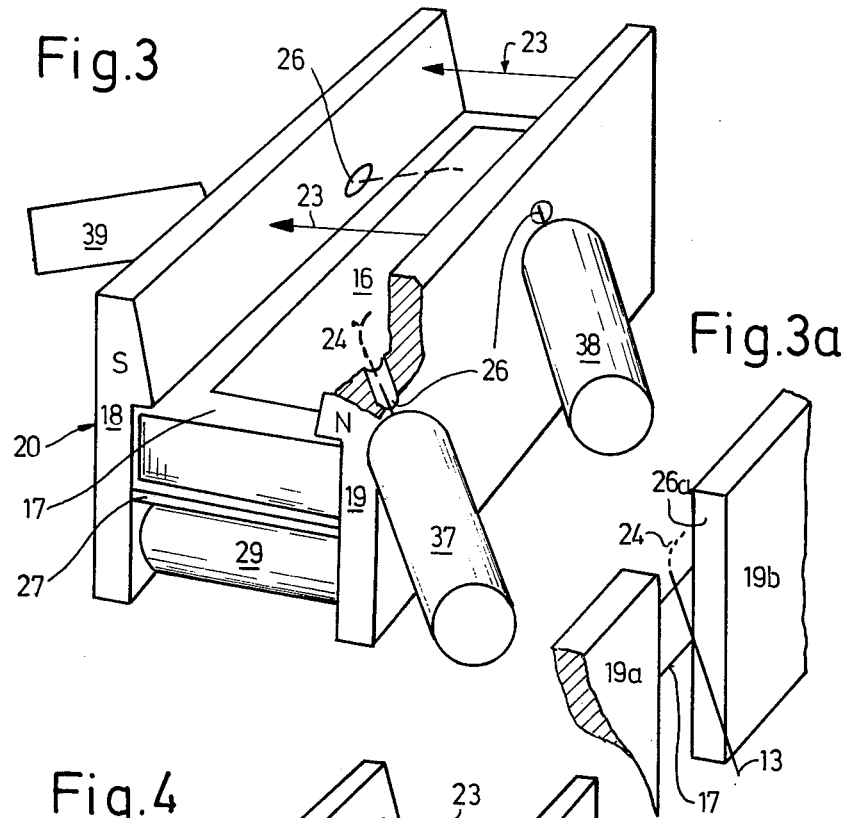
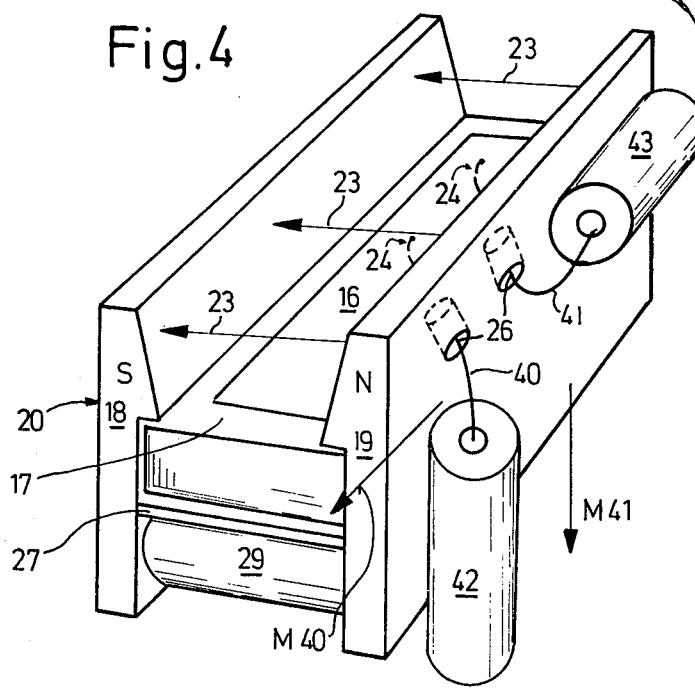

ELECTRON BEAM VAPORIZATION APPARATUS

The present invention relates to electron beam vaporization apparatus, and more particularly to such apparatus to coat by means of electron beam vaporization a web of work surface, particularly wide webs. The apparatus operates in a vacuum, and utilizes a unidirectional magnetic field, generated by magnets having pole shoes located alongside of a vaporization vessel in which the vaporization substance is retained. The vaporization vessel extends approximately over the entire transverse width of the web to be coated by vaporization, and the magnetic field likewise extends approximately along the entire width of the work surface to be coated.

Electron beam vaporization apparatus has previously been proposed, in which the substance to be vaporized is retained within a vessel, or trough having a longitudinal extent matching approximately the width of the substance to be coated. The vaporization substance itself is heated by means of an electron beam which is programmed to be guided horizontally over the surface of the vaporization trough, between the vaporization substance and the workpiece. The electron beam is deflected towards the vaporization substance by means of a magnetic field. The beam itself is symmetrical with respect to rotation and is deflected cyclically. Changing the voltage or the current in the deflection system which generates the magnetic field changes the strength of the magnetic field, so that the electron beam is deflected by different deflection radii. The electron beam is moved back and forth, in longitudinal direction, across the evaporating vessel. The length of the evaporating vessel is limited, however, since otherwise the electron may be projected for too long a distance and, further, by the geometry of the system which requires that the electron beam is carried through the metal vapor, upon vaporization. A high power electron beam gun is, therefore, required. Due to the constant collision of electrons from the beam with the ions of the vaporized substance, which collect above the vaporization substance which is not yet vaporized, the energy of the beam will be different at the terminal ends of the trough; this difference in energy may be substantial and, as a result, the thickness of vaporization, and the vaporization effect is different at the terminal ends of the trough, and, hence, the web to be coated by vapor deposition is not uniformly coated if the web has a substantial width. The width of the web which can be coated uniformly is, therefore, limited. Variations in thickness of coating are particularly apparent if the webs passing over the vaporization trough have a high relative speed with respect thereto, and if the permissable tolerances, thickness of the layer are low.

It has also been proposed to vapor deposit metallic coatings on wide ribbons or bands by locating a plurality of vaporization vessels or crucibles, located between plates forming magnetic pole shoes, and utilizing flat sheet-like electron beams which extend over the entire width of the tapes to be vaporized. Flat beam electron sources are provided over the entire width of the bands to be coated, and the electron bundles are deflected by about 180° by the magnetic field. These arrangements require substantial expenditure for apparatus, are complex, and the coatings resulting therefrom still do not meet high requirements regarding uniformity and homogeneity of the layer or coating.

Vaporization of the vaporization substance can be obtained also by supplying heat from an electron beam gun which is located alongside the crucible or melting pot, or trough which contains the vaporization substance. The electron beam is in sheet or band form and is guided to the vaporization substance through an opening in the side wall adjacent the crucible, before impinging on the vaporization substance. Opposite the perforated side wall, at the other side of the trough, a further limiting wall surface is provided, the terminal walls together forming a vapor direction or guide system, which defines the rising cloud of vaporized substance, directed and deflected in the direction of the web to be coated by vapor deposition. Vapor which spreads in other directions is condensed at the confining walls and guided back into the crucible or vaporization trough. Such arrangements have not been found suitable for wide surfaces, since, on the one hand, an electron beam gun cannot be constructed which has wide sheet-like output, the limit being about five to ten cm; additionally, the band, or sheet-like electron beam tends to focus to a specific impingement spot upon meeting the ionized cloud of vaporized substance, since the ionized cloud will counteract the negative base charge.

It is an object of the present invention to provide an electron beam evaporation apparatus which can be constructed to have any desired length, without interference with vaporization, or spread of the vapor cloud, and in which constructional problems are largely eliminated.

SUBJECT MATTER OF THE PRESENT INVENTION

Briefly, at least one electron beam is so arranged that it enters into a magnetic field alongside of an elongated evaporating trough under an angle between zero and ninty degrees, preferably between 30° and 60° and, desirably, in the order of about 45°; the magnetic field and the electron beam are relatively so matched to each other that the magnetic field deflects the electron beam into a spiral path which penetrates the surface of the vaporization substance.

This arrangement results in a high vapor density, and a plurality of electron beam guns can be used, each impinging the vaporization substance at a selected area, so that the length of the trough, that is, the width of the band to be coated by vapor, can be selected as desired. The vapor deposit is essentially uniform over the entire width of the surface, and the resulting vapor cloud is not shaded by constructional elements and shields arising in operation; sufficient space for the various components of the apparatus is readily available.

Selecting the angle in the preferred range between 30° and 60° with respect to the magnetic field has the advantage that the speed component of the electrons, in a direction perpendicular to the magnetic field is sufficiently high; additionally, the openings through the pole shoes of the magnets will not be long. At an angular range of angles above 30°, no special requirements need to be observed for special focusing, or special bundling of the electron beam.

In accordance with a feature of the invention, a plurality of electron beams are applied to the surface of the vaporization substance, each passing through a cylindrical opening formed in the one, or the other, or both of the pole shoes. Thus, any one of the electron beams enters the region of the vaporization substance close to the surface thereof, and will not have a long path through the vapor cloud, in spite of the fact the magnetic field is generated by lateral pole shoes, providing an extended magnetic field to limit the cloud of vaporized substance. The pole shoes may, however, also be formed with gaps, or in plural parts, to permit entry of the electron beams through the gaps. The electron beam may also be injected laterally from a terminal edge of pole shoes. The latter two embodiments have slight disadvantages with respect to the capture of stray electrons, but are simpler to construct.

The magnetic field strength, and the spatial extent of the magnetic field, as well as the direction of injection of the electron beam are preferably so selected that primary electrons first strayed by the metal vapor, or gas traces in the vacuum system are captured, and do not leave the magnetic field; and that further electrons which are back-scattered from the vaporization substance at the impingement spot are deflected back to the vaporization substance. This substantially increases the efficiency of the vaporization apparatus.

The spatial arrangement is versatile; the path of the electron beam may be linear until the electron beam meets the magnetic field. No deflection magnets, and other apparatus necessary for control and deflection of the electron beam is required. To a certain extent, however, electron emitting filaments may fail too soon, due to the positive ion current to the source. This can be avoided by passing the electron beam, before entering the magnetic field over the vaporization substance, through an additional deflection system, or deflection field, so that positive metal vapor ions can reach the electron beam source only with great difficulty.

The invention is further described by way of illustrative examples with reference to the accompanying drawings, in which:

FIG. 3 is a perspective view of another embodiment of the invention;

FIG. 3a is a fragmentary view illustrating another embodiment of electron beam injection, the remainder of the apparatus of FIG. 3a being similar to that of FIG. 3; and FIG. 4 is a perspective view illustrating another embodiment of the invention.

Figure 1:
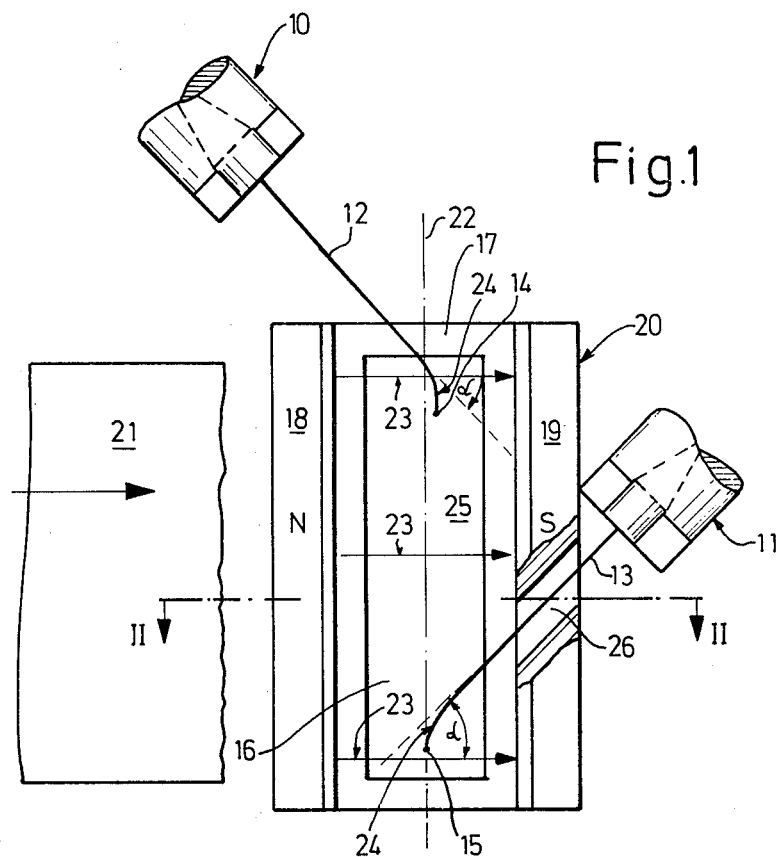
FIG. 1 is a highly schematic top view of of an embodiment of the present invention.

Two electron guns 10, 11 (1) generate electron beams 12, 13, respectively which impinge at impingement spots 14, 15 on vaporization substance 16 in a vaporization trough, or crucible 17. The substance 16 may, for example, be aluminum. The trough 17 is located between terminal pole shoes 18, 19, of a unidirectional magnetic system 20, for example an electromagnet operated with direct current.

A web of carrier substance, to have a layer of vaporized aluminum evaporated thereon is schematically shown at 21, and is carried perpendicular to the longitudinal axis 22 of the trough 17. The entire system is in a vacuum, that is, enclosed in an evacuated vessel (not shown). Movement of the web 21 is preferably continuous. Support and guidance, as well as movement mechanism for web 21 have been omitted for clarity, and may be conventional for guiding a web transverse to a trough, in a vacuum.

The pole shoes 18, 19 of the magnetic system 20 extend over essentially the entire length of evaporating trough 17, or there beyond, and generate a magnetic field schematically indicated by arrows 23, transverse to the longitudinal axis 22 of the crucible 17. The two electron beams 12, 13 enter under an angle $\alpha$, defined as $0° < \alpha < 90°$, with respect to the direction of the magnetic field 23, and is constrained by the magnetic field into a spiral path 24, in which in the drawings only that portion of the path up to the impingement point of the beam on the evaporating substance 16 is visible. The spiral path 24 of the electrons is so generated that the path penetrates the deep surface 25 of the evaporating substance 16, in operation of the system. The electron beams 12, 13, as shown in FIG. 1, have an angle of incidence $\alpha$ of about 45° with respect to the magnetic field 23.

Electron beam 12 is guided laterally at the side of pole shoe 18 into the magnetic field 23. The pole shoe 19 is formed with an opening 26 in the form of a cylindrical bore with an axis parallel to the direction of the electron beam 13. Electron beam 13 passes through this opening. The pole shoes need not be unitary, continuous elements, but may be formed with cuts or slits; the pole shoes may be separate elements located along side each other and leaving a gap, as seen in FIG. 3a with respect to pole shoes 19a, 19b, forming a gap 26a there between. The edges of the gap may be in the direction of the magnetic field 23 or may be canted in the direction of the electron beam. The gap 26a, as shown, may accommodate a beam, at 45° with respect to the field, and impinging the surface 25 of the evaporating substance 16 and passing, with some vertical clearance, in the gap 26a. The path of the electron beams 12, 13 from the electron beam guns until they are deflected by the magnetic field 23 above the evaporating substance is about linear.

Figure 2:
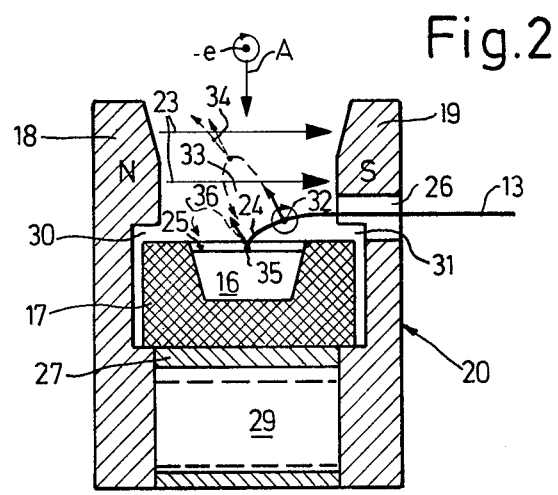
FIG. 2 is a cross-sectional view along line II of FIG. 1 with non-essential parts being omitted.

The pole shoes 18, 19 extend above the trough or crucible 17 (FIG. 2). The pole shoes are mechanically retained by spacers 27, 28, made of non-magnetic material (such as copper plate) and receive their magnetizing force from a dc coil 29 which generates the magnetic field 23. Coil 29 is located between the spaces 27, 28. The trough 17 is an elongated, evaporating crucible, retained in grooves for recess 30, 31 in the pole shoes 18, 19, for ease of replacement by longitudinal sliding out of the pole shoes.

The pole shoes 18, 19 are relatively high, and extend well over the top surface of the evaporating substance 16, even when the crucible is full. They provide for mechanical as well as magnetic guidance and shielding for the metal vapor. The pole shoes, further, serve as traps for stray electrons which are not returned by the magnetic field. The strenght, and spatial distribution of the magnetic field 23 is so adjusted that primary electrons 32 which are once scattered by the metal vapor, or by remaining gases and trace gases in the vacuum system are trapped, so that they cannot leave the magnetic field 23. The path of such primary electrons 32 is indicated by the line 33. These once scattered primary electrons can leave the magnetic field only if they are scattered a second time, as indicated by the second scatter paths 34. The angle of incidence of the electron beams 12, 13, in this spatial distribution of the magnetic field 23 are so selected and matched to each other that electrons 35 which are back-scattered from the impingement spots 14, 15 at the surface 25 of the evaporating substance 16 are deflected back to the evaporating substance 16 in a path 36. This substantially increases the efficiency of the apparatus and decreases heating of the web 21, to be coated by vapor deposition, by stray or scattered electrons. The return deflecting force A (FIG. 2) can be derived from the laws of magnetic fields. If a moving electron e corresponding to the electron beam 12, or 13 has a speed vector component out of the plane of the drawing, then the force A is directed downwardly due to the field of the electron which tends rotation to the right and its interaction with the magnetic field 23 which has a direction from left to right in the drawing (FIG. 2).

The embodiment of FIG. 3; Two electron guns 37, 38 are located at one side of the evaporating trough, and a third evaporating gun 39 is located at the other side of the evaporating trough 17. The electron beams, as in the embodiment of FIG. 1, extend approximately rectilinearly until they enter the magnetic field; they are then deflected by the magnetic field in the manner previously explained, to the evaporating substance 16. In all other respects, the embodiments of FIG. 3 is similar to that of FIGS. 1 and 2 and similar parts have been given similar reference numerals.

Embodiment of FIG. 4: Two electron guns 42, 43 generate electron beams 40, 41 respectively. These beams do not extend linearly to the magnetic field but, rather, pass a deflection field M40 and M41, respectively, external to the pole shoe 19. The deflecting magnets (or electrostatic deflection plates) to effect such deflection are well known and omitted from the drawing for clarity. The arrangement is somewhat more complicated and more expensive than that of the embodiments of FIGS. 1–3, in which the electron beam is straight; the embodiment of FIG. 4, however, has the advantage that positive metal vapor ions can reach the electron guns only with great difficulty: such ions may damage the electron guns. In all other respects, the embodiment of FIG. 4 is similar to that of previous embodiments described and similar parts have been given similar reference numerals.

Coating of wide surfaces, such as wide, running webs, ribbons and the like by vapor deposition requires high density of the vapor; uniformity of vapor deposition over the entire width of the web is a prerequisite for practical utilization of the method, that is, to obtain high quality in the resulting vapor deposited material. In order to meet these requirements, a long trough or crucible, extending over the entire width to be vapor deposited is necessary. Emission of metal vapor should be as uniform as possible over its entire lenght; at least, emission of vaporized substance should be derived from the crucible in uniform spaced distances. Heating of the vaporization substance, as previously carried out, leads to difficulties in spatial arrangement, either because shielding of the vapor could not be avoided, or since room for the necessary apparatus and components was not available. An electron beam, particularly when it must penetrate metal vapor may have only a very short finite length; long beam paths, even if very high acceleration energy is used, are not feasible.

The electron beam vaporization apparatus in accordance with the present invention can be made at any desired length. The surface of the crucible is subjected to a magnetic field which is comparatively short, since it is transverse to the longitudinal direction, or axis of the crucible. The length of the necessary magnetic field is one of the essential criteria for the possible overall length of the crucible, if the field extends parallel thereto; in accordance with the present invention, the field extends transverse, and an essential feature of the present invention is the combination of the transverse field with electron beams which are guided to interact with the field at an angle greater than 0°, less than 90°, and preferably between 30° and 60°, desirably 45°, with respect to the direction of the magnetic field. Any desired number of electron guns may then be provided, each generating an electron beam, parallel to the next, and impinging the surface 25 of the vaporization substance at respective impingement points, uniformly spaced along the length, and ajacent each other. The electron beams, by interaction with the magnetic field transverse to the longitudinal direction of the trough, or crucible, are accelerated in a direction which has a speed vector transverse to the direction of the magnetic shield and thus will be constrained into a short, spiral path to reach the surface of the vaporization substance by spiraling downwardly.

Penetration of the electron beams into the magnetic field may be obtained by passing the electron field through one or more lateral openings in the pole shoes, laterally at the sides of the poles. The height of injection is so selected that the path of the electron beam would still be beneath the surface of the vaporization substance if the vaporization trough or crucible is only partially full, that is, the impingement point of the electron beam will be at the first intersection of this downwardly spiraling path of the electron beam with the surface of the vaporization substance. By suitable dimensioning of the angle of incidence of the electron beam, height of incidence, magnetic field strength, and the extent of the magnetic field, as well as the shape and direction of the magnetic field, and matching these characteristics to the acceleration voltage of the electron beam, all requirements regarding coordinates of the impingement point, capture of stray or scattered electrons, and distribution of the resulting vaporized cloud may be met. The magnetic field is selected to have such a spatial extent and field strength that scattered electrons which are scattered with primary speed at the impingement point of the beam are returned to the bath, that is to the vaporization substance, and such that those electrons which are in the vapor must, at least twice and at an unlikely angle, collide with each other in order to be able to leave the magnetic field.

The arrangement of the radiation generating system can be fitted to the necessary requirements; the simplest systems provide for straight line electron beams; these systems are, however, subject to some slight feedback or reaction of the vapor on the cathodes of the electron beam guns, particularly if the cathodes have a rather large angle with respect to the magnetic field. This is avoided in the embodiment of FIG. 4, in which the deflection angle for the electron beam 40 is 90°, and the deflection angle for the electron beam 41 from gun 43 is 135°.

Test example: The electron beams were accelerated with 14 kV, and are injected at an angle alpha = 45° with respect to magnetic field 23 at a height of 3.37 cm parallel to the surface 25 of the vaporization substance, through openings 26 having a diameter of 3 cm. The magnetic field 23 had a strength of 100 G and extended to a height of 12 cm above the surface 25 of the vaporization substance 16. The impingement spots 14, 15 of the electron beams 12, 13 were spaced 3.4 cm in longitudinal direction and 5.3 cm in transverse direction from the entry point into the magnetic field 23.

Various changes and modifications may be made and features described in connection with any one embodiment may be used, as applicable, with any one of the others, within the inventive concept.

We claim:

1. Electron beam vaporization apparatus to vaporize the vaporization substance (16) and apply such substance, in a vacuum, on a work surface (21) particularly wide tapes, webs, or the like, said apparatus having an elongated evaporation substance holding vessel, or trough or crucible (17);

a magnet system (18, 19, 19a, 19b; 29) located alongside both sides of the elongated vessel (17) and generating a magnetic field (23) transverse to the major dimension of the vessel, and the improvement wherein at least one electron beam (12, 13, 40, 41) is provided, directed towards the substance (16) in the vessel (17) said beam being directed through said field to interact therewith, the direction of the beam upon interaction with the field being at an angle ($\alpha$) greater than zero and less than 90° with respect to the direction of the magnetic field (23), the strength of the magnetic field and the charge of the electron beem with respect to said angle having such relative values that the electron beam is deflected by interaction with the magnetic field to assume a spiral path which penetrates the surface (25) of the evaporation substance (16).

2. Apparatus according to claim 1 wherein the angle ($\alpha$) is between 30° and 60°.

3. Apparatus according to claim 2 wherein the angle ($\alpha$) is in the order of about 45°.

4. Apparatus according to claim 1 wherein at least one of the pole shoes (18, 19) is formed with an opening (26) and the electron beam (13, 40, 41) enters the magnetic field (23) through said opening.

5. Apparatus according to claim 4 wherein the opening, or at least one of the openings, is formed as a cylindrical bore (26).

6. Apparatus according to claim 4 wherein the opening, or at least one of the openings is formed as a slot (26a).

7. Apparatus according to claim 1 wherein the pole shoes are formed in a plurality of elements (19a, 19b) spaced from each other by a gap (26a) and the electron beam (13) enters the magnetic field through said gap.

8. Apparatus according to claim 1 wherein the electron beam (12) enters the magnetic field laterally adjacent the end of the pole shoe (18).

9. Apparatus according to claim 1 wherein the magnetic field strength and the spatial distribution of the magnetic field are so dimensioned and arranged that primary electrons (32) first scattered from the vapor of the vaporizable substance, or from remaining gas traces in the vacuum are captured in the magnetic field and do not leave said magnetic field.

10. Apparatus according to claim 1 wherein the path of the electron beam (12, 13, 40 41) and the spatial distribution of the magnetic field are so dimensioned and arranged that electrons (35) liberated at the impingement point of the electron beam on the surface (25) of the vaporization substance (16) are deflected back to the vaporization substance (16).

11. Apparatus according to claim 1 wherein the path of the electron beam (12, 13) up to the entry of the beam into the magnetic field (23) is approximately straight.

12. Apparatus according to claim 1 wherein the path of the electron beam (40, 41) up to entry of the beam into the magnetic field is curved.

13. Apparatus according to claim 12 further comprising at least one beam deflection field (M40, M41) interacting with the electron beam (40, 41) outside of said transverse magnetic field (23) to deflect the electron beam from its source to have said direction at said angle ($\alpha$) with respect to the direction of the transverse magnetic field (23).

* * * * *